United States Patent [19]
Takeuchi et al.

[11] Patent Number: 5,238,876
[45] Date of Patent: Aug. 24, 1993

[54] METHOD OF DIVIDING SEMICONDUCTOR WAFER USING ULTRAVIOLET SENSITIVE TAPE

[75] Inventors: Toshio Takeuchi; Ichiro Hayashi; Shuichi Osaka, all of Itami, Japan

[73] Assignee: Mitsubishi Denki Kabushiki Kaisha, Tokyo, Japan

[21] Appl. No.: 554,436

[22] Filed: Jul. 19, 1990

[30] Foreign Application Priority Data

Jul. 21, 1989 [JP] Japan .................. 1-187430

[51] Int. Cl.5 .................. H01L 21/302; H01L 21/304
[52] U.S. Cl. .................. 437/226; 432/209; 432/173; 432/926
[58] Field of Search .................. 437/226, 209

[56] References Cited

U.S. PATENT DOCUMENTS

| | | | |
|---|---|---|---|
| 4,897,141 | 1/1990 | Girard | 437/226 |
| 4,999,242 | 3/1991 | Ishiwata et al. | 428/354 |

FOREIGN PATENT DOCUMENTS

| | | | |
|---|---|---|---|
| 0050637 | 4/1980 | Japan | 437/226 |
| 0051521 | 3/1983 | Japan | 437/227 |
| 0142543 | 8/1983 | Japan | 437/226 |
| 0047492 | 3/1985 | Japan | 437/226 |
| 0210650 | 9/1986 | Japan | 437/226 |
| 0090943 | 4/1987 | Japan | 437/226 |
| 0164046 | 6/1989 | Japan | 437/226 |

OTHER PUBLICATIONS

"Automatic Wafer Mounting System", Disco Abrasive Systems, DFM-A150, Nov. 1983.
"Fully Automatic, In-Line Wafer Mounting/Dicing/Cleaning System", Disco Abrasive Systems, Nov. 1983.

*Primary Examiner*—Olik Chaudhuri
*Assistant Examiner*—Long Pham
*Attorney, Agent, or Firm*—Leydig, Voit & Mayer

[57] ABSTRACT

A method and an apparatus for producing semiconductor devices in which a semiconductor wafer is adhered to an ultraviolet sensitive tape, the adhesion force of which decreases upon irradiation with ultraviolet rays, the ultraviolet sensitive tape being adhered to a ring frame so that the semiconductor wafer is fixed to the ring frame with the ultraviolet sensitive tape. Successive semiconductor wafers thus fixed to respective ring frames are subjected to a series of steps including dicing, breaking, and ultraviolet irradiation for reducing the adhesiveness of the ultraviolet tape. The semiconductor wafer, broken and divided in dice and held by the ultraviolet sensitive tape with reduced adhesiveness, is sent to a next step, such as a die-bonding step.

8 Claims, 7 Drawing Sheets

FIG. IA
PRIOR ART
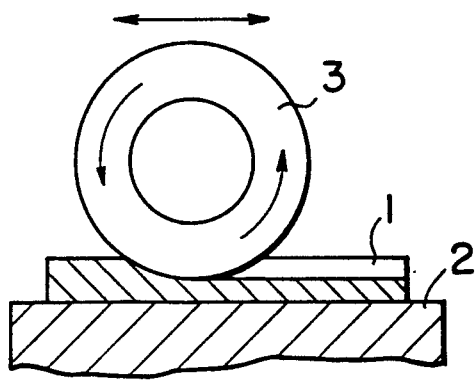
FIG. IB
PRIOR ART
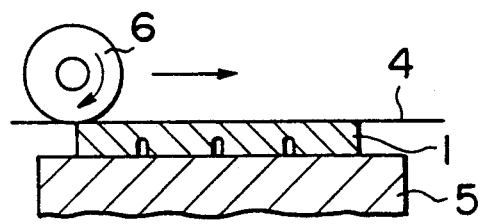
FIG. IC
PRIOR ART
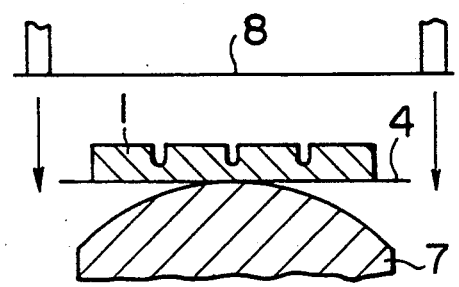
FIG. ID
PRIOR ART
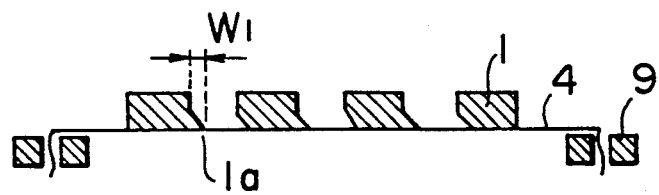

METHOD OF DIVIDING SEMICONDUCTOR WAFER USING ULTRAVIOLET SENSITIVE TAPE

BACKGROUND OF THE INVENTION

1. Field of the Invention

The present invention relates to a method of and an apparatus for producing a semiconductor device. More particularly, the present invention is concerned with a method of dividing a semiconductor wafer into dice and also with an apparatus for carrying out this method.

2. Description of the Related Art

FIGS. 1A to 1D are schematic illustrations of successive steps of a conventional method of producing a semiconductor device. More specifically, FIG 1A shows a dicing step, FIGS. 1B and 1C show a breaking step and FIG. 1D shows an expanding step. Referring first to the dicing step shown in FIG. 1A, cut lines defining dice are scribed in a wafer 2 fixed on a wafer vacuum table of a dicing apparatus by cutting with a blade 3 to a depth which is about ½ the thickness of the wafer 1. After the scribing of the cut lines, the wafer 1 is demounted from the wafer vacuum table 2 and an expandable sheet 4 is adhered to the back side of the wafer 1. In the breaking method shown in FIGS. 1B and 1C, the wafer 1 is divided into dice. More specifically, in the method shown in FIG. 1B, the wafer 1 is placed upside down on a break table 5, and a rotatable break roller is pressed onto the wafer 1 so as to generate cracks along the cut lines, thereby to divide the wafer into dice. On the other hand, in the breaking method shown in FIG 1C, the wafer is placed on a break table 7 such that the scribed side of the wafer 1 is directed upward, and a thin plate 8 capable of being curved along the curvature of the break table 7 is pressed onto the wafer 1 so as to deform the wafer 1 by utilizing the curvature of the break table 7, so that the wafer 1 is cracked along the cut lines and divided into dice. After the breakage of the wafer, the expandable sheet 4 is stretched as shown in FIG. 1D so that the gaps between adjacent dice are enlarged to values greater than the width $W_1$ of the bevel 1$a$ formed by the breakage, and is fixed by means of an expansion ring 9 in this state. The wafer 1, now assuming a state shown in FIG. 1D, is delivered to a subsequent die bonding step (not shown). Successive lots of wafers, each having a cassette containing about 20 sheets of the wafer, are supplied to the production line.

The described known method of producing semiconductor devices suffers from the following problems.

(a) In view of a risk of the wafer being undesirably cracked during the conveying step after the dicing, it is not allowed to fully or semi-fully cut the wafer, and it can only be cut to half depth. Consequently sometimes the wafer fails to break at a local portion of the wafer.

(2) The breakage is effected by applying pressure to the dice surface, as shown in FIG. 1B or FIG. 1C, so that the dice tend to be damaged, reducing the yield and the quality of the product.

(c) The bevel width is inevitably small due to the fact that the wafer is cut only to half the thickness thereof, so that the expanding step for increasing the dice interval is essentially required.

(d) Conventionally used expansion rings are becoming unusable as a result of the current trend for larger wafers.

(e) Quality of the products undesirably fluctuate due to the employment of manual labor.

(f) Each step is executed on the lot basis so that the efficiency of the work is impaired because the successive steps are conducted independently. Consequently, a long production time is required.

SUMMARY OF THE INVENTION

Accordingly, an object of the present invention is to provide a method of and an apparatus for producing a semiconductor device which can cope with the current demand for larger wafers and which allows the wafer to be semi-fully or fully cut, thus improving the product quality and shortening the production time, thereby overcoming the above-described problems of the prior art.

To these ends, according to one aspect of the present invention, there is provided a method of producing semiconductor devices by dividing a semiconductor wafer into a plurality of dice, comprising a wafer mounting step in which the semiconductor wafer is adhered to an ultraviolet sensitive adhesive tape which loses its adhesiveness when irradiated by ultraviolet rays and which in turn is adhered to a ring frame, thus fixing the semiconductor wafer to the ring frame; a dicing step in which cut lines for dividing the semiconductor wafer into a plurality of dice are scribed in the semiconductor wafer; a breaking step in which a breaking jig is plunged against a reverse side of the semiconductor wafer opposite to the side in which the cut lines are scribed so that the wafer breaks at the cut lines; and an ultraviolet irradiation step in which the ultraviolet sensitive tape is irradiated with ultraviolet rays so as to reduce the adhesiveness of the ultraviolet tape wherein the dicing step, the breaking step and the ultraviolet irradiations step are executed on the semiconductor wafer while the semiconductor wafer is adhered to the ultraviolet sensitive tape.

The invention also provides an apparatus suitable for use in carrying out the production method stated above.

The above and other objects, features and advantages of the present invention will become clear from the following description of the preferred embodiments of the present invention when the same is read in conjunction with the accompanying drawings, in which:

BRIEF DESCRIPTION OF THE DRAWINGS

FIGS. 1A to 1D are schematic illustrations of successive steps of a conventional process for producing semiconductor devices, explanatory also of an apparatus for use in conducting the method;

DESCRIPTION OF THE PREFERRED EMBODIMENTS

Figure 2A:
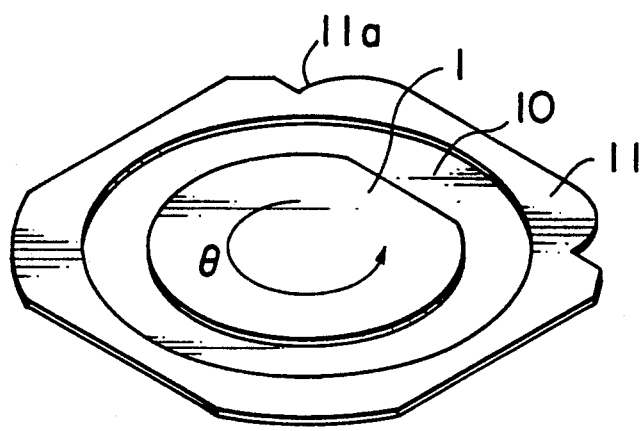
FIGS. 2A to 2D are schematic illustrations of a wafer mounting step, dicing step, breaking step and ultraviolet irradiation step according to a method of the present invention.
Figure 2B:
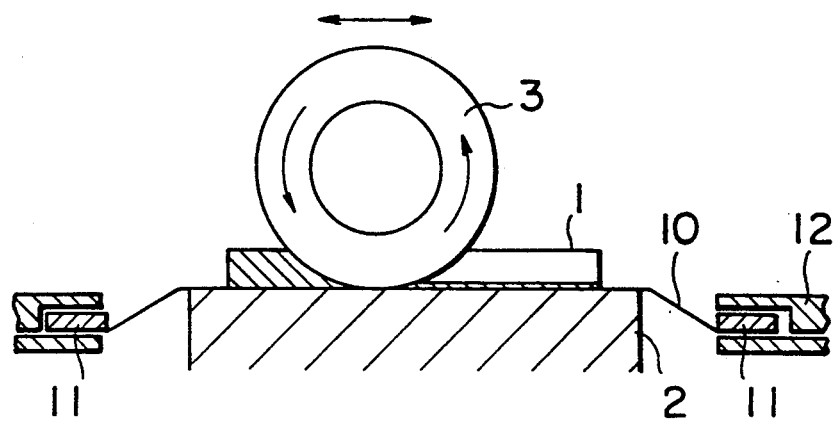
Figure 2C:
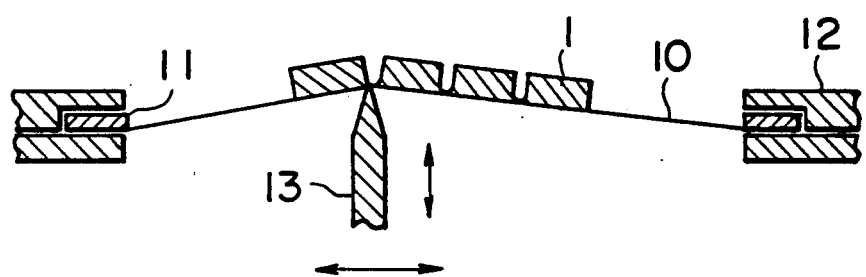
Figure 2D:
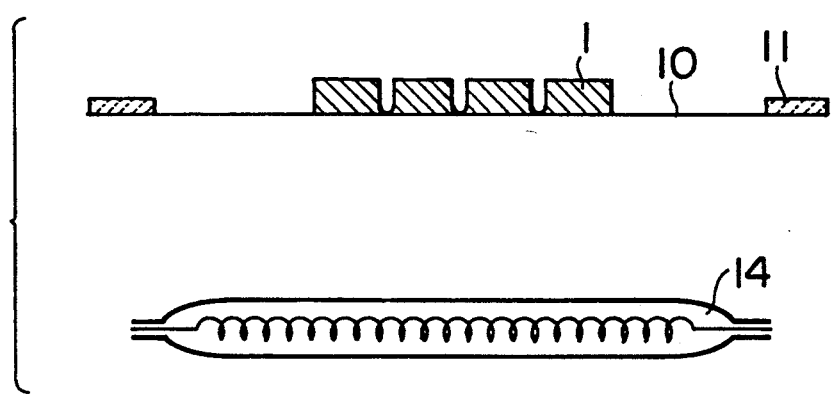
Figure 3:
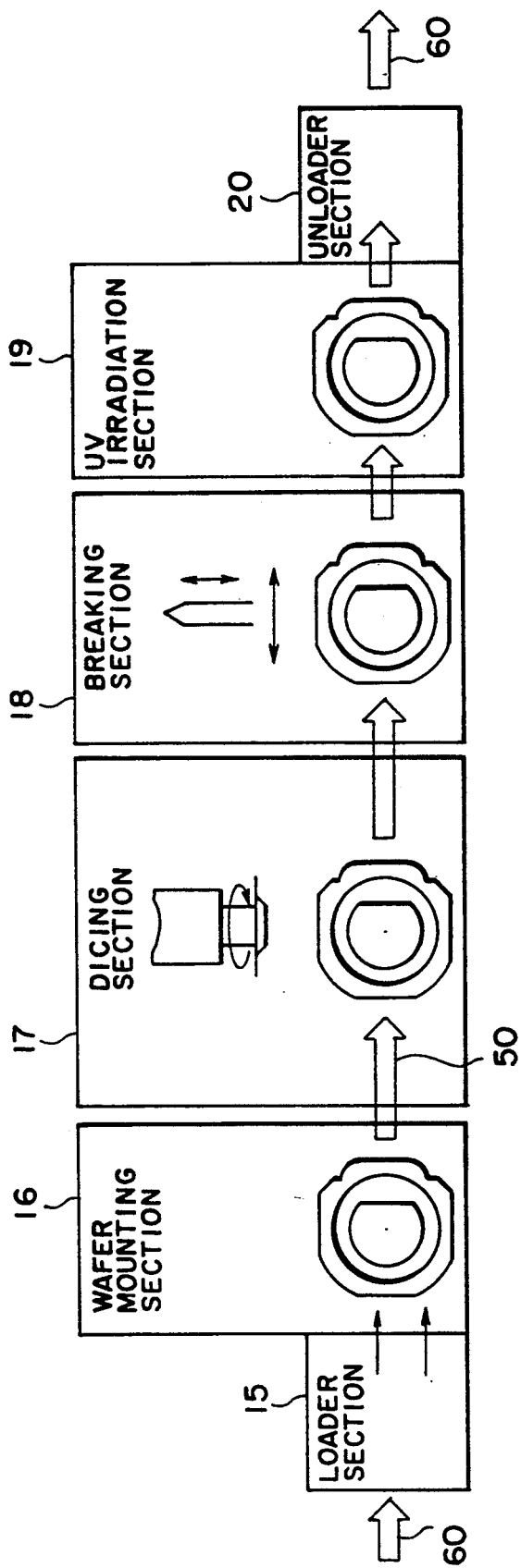
FIG. 3 is an illustration of a method of producing a semiconductor device of the present invention, showing also the basic construction of a production apparatus of the present invention.

An embodiment of the present invention will be described with reference to the drawings. FIGS. 2A to 2D schematically show successive steps of a method of the present invention for producing semiconductor devices. More specifically, FIG. 2A shows a wafer mounting step, FIG. 2B shows a dicing step, FIG. 2C shows a breaking step and FIG. 2D shows an ultraviolet irradiation step. In these Figures, the same reference numerals are used to denote the same parts or members as those in the prior art explained in connection with FIGS. 1A to 1D The illustrated embodiment of the method of the present invention employs an ultraviolet sensitive tape 10 (See FIG. 2A) which normally exhibits a high adhesiveness but loses its adhesiveness when irradiated with ultraviolet rays. The method also employs a ring frame 11. The ultraviolet sensitive tape 10 to which the wafer 1 is adhered is adhered to the ring frame 11, whereby the wafer 1 is supported. The ring frame 11 has a locating portion 11a by means of which it is located in the rotational direction indicated by θ. A chuck 12 (see FIGS. 2B and 2C) grasp and fixes the frame ring 11 in a fixed position. A table 2 is raised relative to the chuck 12 or the frame ring 11 is depressed relative to the table 2, stretching the tape 10. The wafer 1 attached to the tape 10 is thereby elevated relative to the frame ring 11. A blade 3 scribes cut lines in the wafer 1. These operations are all illustrated in FIG. 2B. Thereafer, as shown in FIG. 2C, a breaking jig 13 is plunge against the wafer 1 from the side opposite to the scribed cut lines, thereby breaking the wafer 1 into dice. An ultraviolet lamp 14 (see FIG. 2D) is adapted to apply ultraviolet sensitive rays to the ultraviolet tape 10 thereby to reduce the adhesive force of the tape 10. FIG. 3 schematically shows the basic construction of the semiconductor production apparatus embodying the invention. Referring to this Figure, the apparatus includes a wafer mounting section 16 following a loader section 15 through which materials are loaded. A dicing section 17, a breaking section 19 and an ultraviolet irradiation section 19 are arranged in series in the mentioned order on the downstream side of the wafer mounting section 16. An unloader section 20 for unloading the wafer after the processing is disposed on the downstream side of the ultraviolet irradiation section 19. The arrangement shown in FIG. 3 is a basic one and the construction of the apparatus shown in FIG. 3 may be modified depending on the types of devices which are disposed upstream of the wafer mounting section 16 and downstream from the ultraviolet irradiation section 19. In FIG. 3, an arrow 50 denotes means for conveying a ring frame 11 to which the wafer 1 is fixed, between successive sections, while numeral 60 denotes means provided upstream of the loader section 15 and downstream from the unloader section 20 for the purpose of conveying the materials.

The operation of this production apparatus will be briefly explained with reference to FIGS. 2A to 2D and FIG. 3. When a material such as a wafer 1 or the like is supplied to the wafer mounting section 16 through the loader section 15, the ultraviolet sensitive tape 10 having high adhesive force is adhered to the wafer 1 in the wafer mounting section 16, and this ultraviolet sensitive tape 10 is adhered also to the ring frame 11. The wafer 1 thus fixed to the ring frame 11 is automatically fed to the dicing section 17 in which the wafer 1 is fixed to a vacuum table 2. The ring frame 11 is fixed to pressed by the chuck 12 so as to tension the ultraviolet tape 10 such that the upper surface of the ring frame 1 is below the level of the upper surface of the vacuum table 2. In this state, a blade 3 operates to scribe cut lines in the wafer 1. The scribing is conducted in a semi-full cut or full-cut manner such as to leave an uncut portion which is 30 μm or less. The wafer 1 after the scribing of the cut lines, still being fixed to the ring frame 11, is automatically fed to the breaking section 18. In this section 18, a breaking jig 13 plunges the wafer while the ring frame 11 to which the wafer 1 is fixed is rigidly held by the chuck 12, whereby all the portions are broken at the cut lines. The wafer 1 thus broken is automatically conveyed to the ultraviolet irradiation section 19 in which ultraviolet rays emitted from the ultraviolet lamp 14 are applied to the ultraviolet sensitive tape 10, whereby the adhesion force of the tape is reduced. The wafer 1 is then automatically conveyed to the unloader section 20 and is discharged from the production line through the unloader section 20. The above-described operation including the consecutive steps is continuously conducted for successive sheets of wafer. The delivery of the wafer 1 to the die-bond apparatus may be executed while the wafer 1 is kept fixed to the ring frame 11. When the die-bonding apparatus is of the type which does not allow the die-bonding to be conducted without separation of the wafer from the frame ring 11, the frame ring 11 maybe replaced with an expansion ring used in the conventional art, before the delivery to the die-bonding apparatus.

As explained before, the construction of the production apparatus of the present invention can have a variety of forms according to the devices which are connected to the upstream end and the downstream end of the apparatus, as will be understood from the following description of different embodiments in which the same reference numerals are used to denote the same components or members as those of the first embodiment described in connection with FIGS. 2A to 2D.

Figure 4:
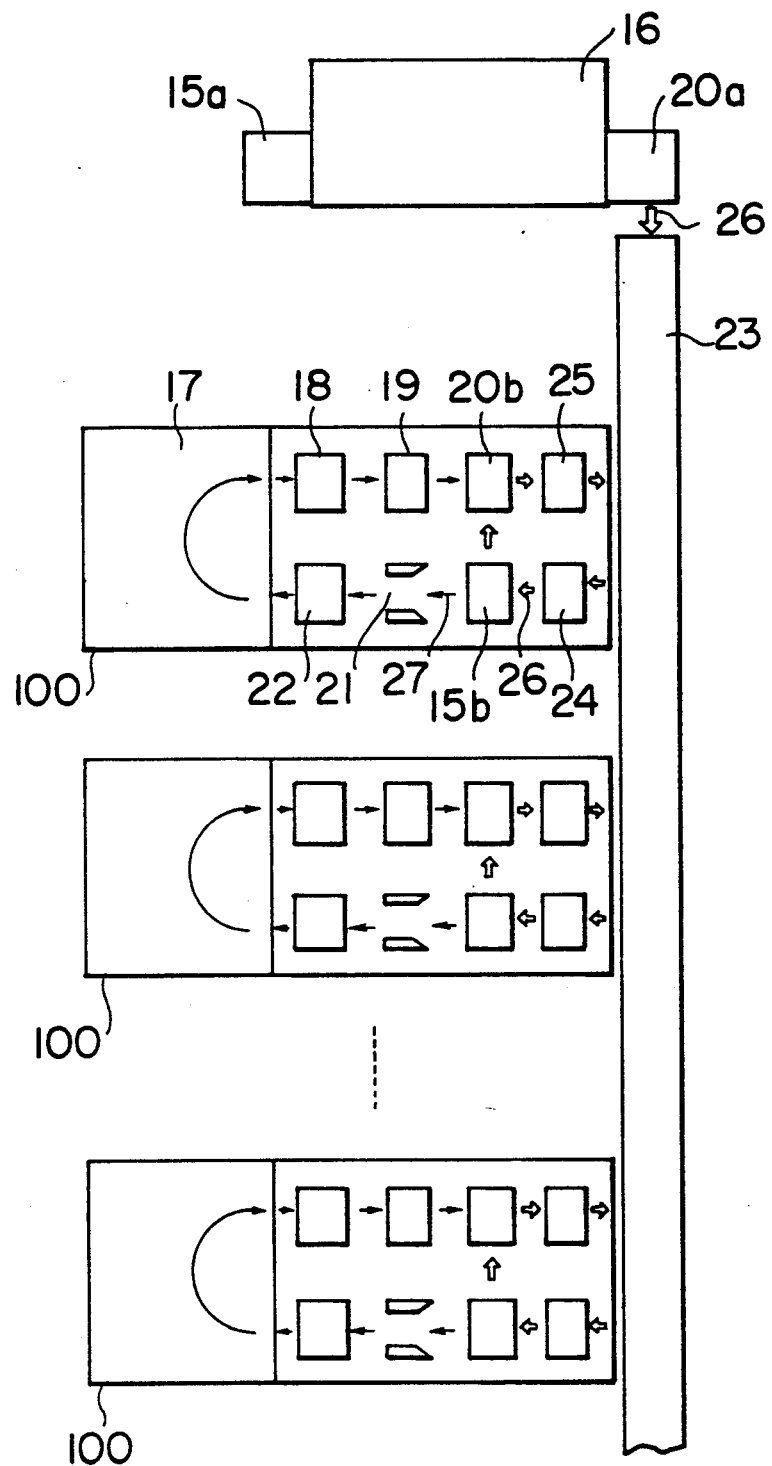
FIG. 4 is an illustration of an embodiment of the method of the present invention for producing semiconductor devices and a production apparatus suitable for carrying out this method.

FIG. 4 show a different embodiment of the present invention in which a wafer mounting section 16 including a first loader section 15a and a first unloader section 20a is provided separately. A batch of wafer sheets, e.g., 20 sheets, which have not been fixed to the ring frames yet, are accommodated by a wafer cassette (not shown) which is moved to the loader section 15a. In the loader section 15a, therefore, an operation is conducted for picking up the wafers one by one from the wafer cassette. In the wafer mount section 16, wafers 1 are fixed to the rings frames 11 and then fed to the unloader section 20a. In the unloader section 20a, the wafers 1 together with the rings frames 11 to which they are fixed are put in a specific ring frame cassette which is different from the wafer cassette mentioned above. For instance, 20 sheets of wafer sheets with rings frames 11 are accommodated in each ring frame cassette. The ring frame cassette accommodating the wafers 1 fixed to the ring frame cassettes is supplied to each unit 100 through a cassette convey path 26 and a conveyor system 23 in the factory to respective units 100. The wafer mount section 16 operates at a higher processing speed than other sections, so that a single wafer mounting section 16 can deliver the wafers 1 fixed to the rings frames 11 to a plurality of units 100. The ring frame cassette delivered to each unit 100 is stationed at an input station 24 and is then fed therefrom to a second loader section 15b by means of a cassette automatic conveyor passage 26. In an elevator section 21, all the rings frames 11 to which the wafers 1 have been fixed are taken out of the ring frame cassette and these rings frames are stored in the elevator section. In a prealignment section 22, the rings frames 11 are taken one by one out of the elevator section 21 and are located in the direction θ (see FIG. 2A). The wafers 1 are conveyed while they are still fixed to the rings frames 11, from the second loader section 15b to the second unloader section 20b along an automatic ring frame conveyor passage 27. The ring cassette, from which the rings frames 11 have been taken out at the second loader section 15b, is transported to the second unloader section 20b where it waits for the rings frames 11 to which processed wafers 1 are fixed. Thus, the rings frames 11 to which the processed wafers 1 are fixed are again accommodated in the ring frame cassette 11. The ring frame cassette accommodating a predetermined number of ring frames 11 is then delivered to an output station 25 and then forwarded through a transportation system 23 in the factory to the next processing device, e.g., a die bonding device. It will be seen that the first loader section 15a and the second loader section 15b handle different types of cassettes, whereas the first unloader section 20a and the second unloader section 20b handle the same type of cassette.

Figure 5:
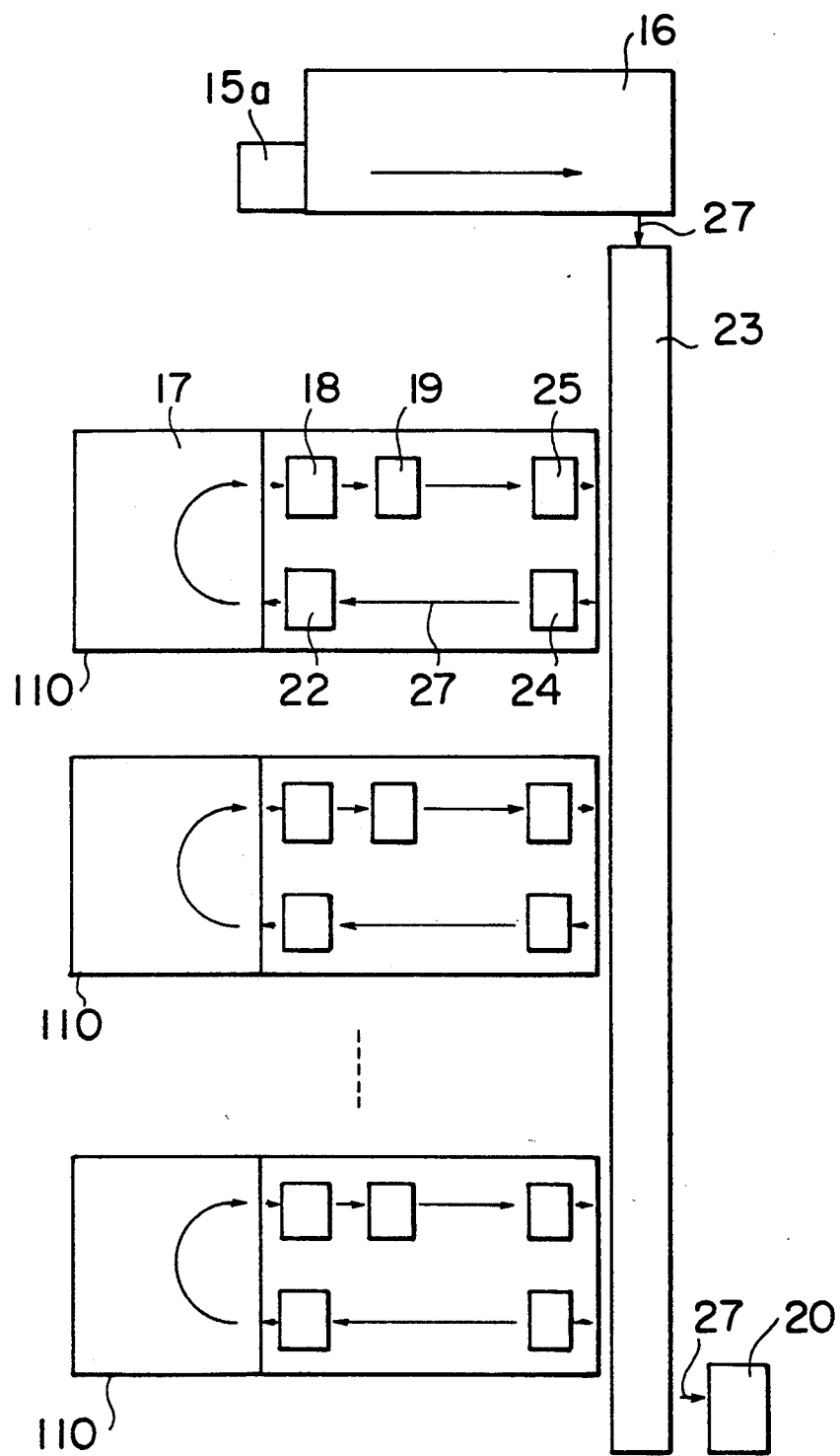
FIG. 5 is an illustration of another embodiment of the method of the present invention for producing semiconductor devices and a production apparatus suitable for carrying out this method.

FIG. 5 shows a different embodiment in which a wafer mounting section 16 including a first unloader section 15a is provided separately. Wafers 1 fixed to the ring frames 11 are successively supplied one by one to each unit 110 through a transportation system 23 in the factory. The unloader section 20 also is arranged commonly for a plurality of different units 110. In each of the units 110, the ring frames 11 with the wafers 1 fixed thereto, received from the transportation system 23 inside the factory, are stationed at an input station 24. All the steps of process conducted in the unit 110 are executed while the wafers 1 are still fixed to the frame ring frames 11. The ring frames 11, with the processed wafers 1 fixed thereto, are transported from an output station 25 to the unloader section 20 through the transportation system 23 inside the factory.

Figure 6:
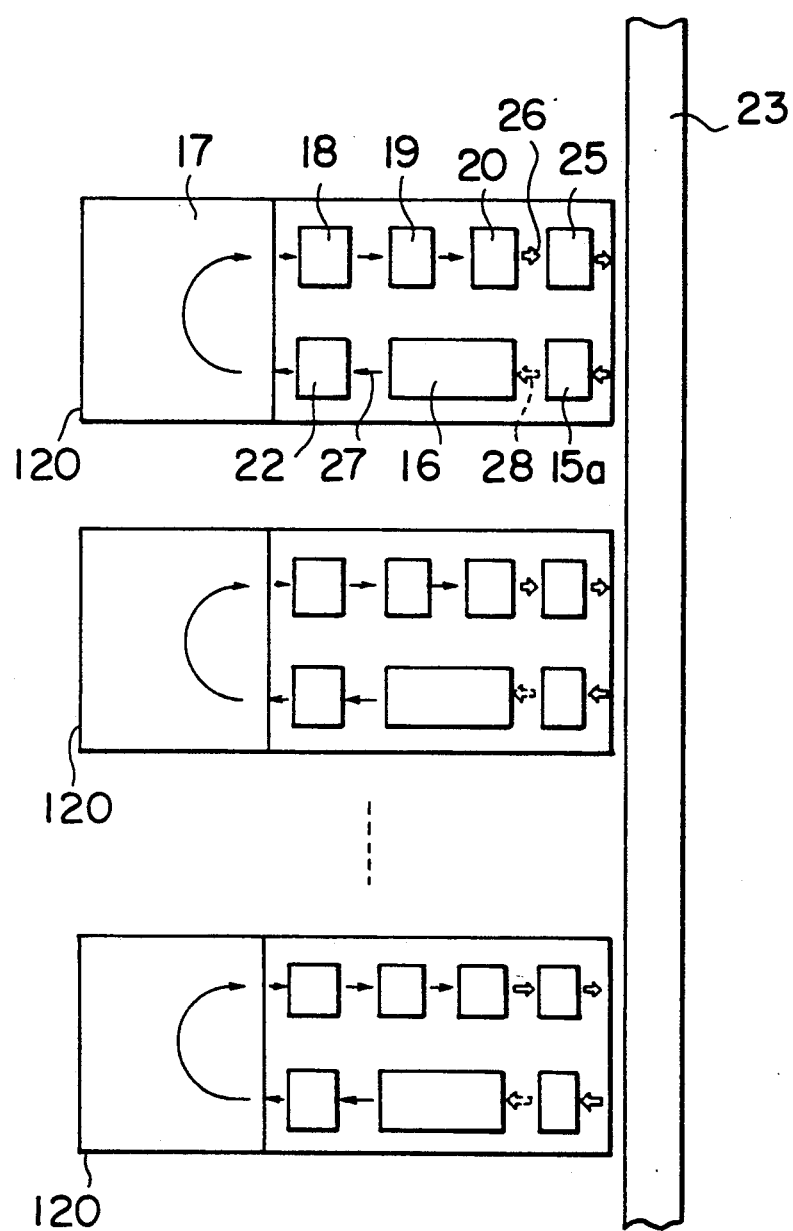
FIG. 6 is an illustration of still another embodiment of the method of the present invention for producing semiconductor devices and a production apparatus suitable for carrying out this method.

FIG. 6 shows a different embodiment in which a common transportation system 23 inside the factory is arranged for a plurality of units 120 which are arranged in parallel with one another. Each of the units 120 includes a series of sections starting with the first unloader section 15a and ending in the unloader section 20a and including the wafer mounting section 16. A wafer cassette accommodating a plurality of sheets of sheets of wafer 1 is supplied from the transportation system 23 to the first loader section 15a of each unit 120. The loader section 15a takes the wafers one by one from the cassette and delivers the sheets of wafer 1 one by one to an automatic wafer conveyor passage 28 which conveys these successive sheets of wafer 1 to the wafer mounting section 16. The wafers are then fixed to the ring frames 11 in the mounting section 16. The wafers 1 are then moved from the wafer mounting section 16 to the unloader section 20 together with the ring frames 11 fixed thereto, by means of ring frames automatic transportation passage 27, so that processes are executed on the wafers 11 fixed to the ring frames 11. At the unloading section 20, the ring frames 11 with the processed wafers 1 fixed thereto are accommodated in the ring frame cassette. The ring frame cassette, charged with a predetermined number of ring frames with processed wafers 1, e.g., 20 frame rings, is delivered to an output station 25 through an automatic cassette conveyor passage 26. The ring frame cassette is then stationed at the output station 25 until it is fed to a next step of production process.

As may be understood from the foregoing description, according to the present invention, a wafer is adhered to an ultraviolet sensitive tape which reduces its adhesive force by irradiation with ultraviolet sensitive rays, and the ultraviolet tape is adhered to a ring frame whereby the wafer is fixed to the ring frame. Then, successive wafers thus fixed to frame rings are continuously processed through the dicing section, breaking section and ultraviolet irradiation section. It is therefore possible to shorten the time required for production and to realize a fully aromatic production thus saving human power. Furthermore, since the scribing of the cut lines for dicing can be conducted to a greater depth into the wafer, it is possible to realize non-contact breakage of the wafer, i.e., without requiring mechanical contact with the wafer surface. In addition, the wafer can be supplied to a step such as die bonding subsequent to the process performed by the production apparatus of the invention, with the adhesive force of the ultraviolet sensitive tape reduced by the irradiation with ultraviolet rays, with the result that the quality and yield are remarkably improved. It is also to be pointed out that the production method of the present invention copes well with demand for larger wafer sizes.

We claim:

1. A method of producing semiconductor devices by dividing a semiconductor wafer into a plurality of dice comprising:

adhering a generally annular frame to an ultraviolet sensitive tape, the adhesiveness of said ultraviolet sensitive tape weakening when said ultraviolet sensitive tape is irradiated with ultraviolet light;

placing a semiconductor wafer within said annular frame and adhering said semiconductor wafer to the ultraviolet sensitive tape adhered to said frame;

depressing said annular frame relative to said semiconductor wafer, thereby stretching said ultraviolet sensitive tape and elevating said semiconductor wafer relative to said annular frame;

scribing said semiconductor wafer adhered to said ultraviolet sensitive tape along cut lines on the side of said semiconductor wafer opposite said ultraviolet sensitive tape while said semiconductor wafer is elevated relative to said frame, thereby dividing said semiconductor wafer into a plurality of dice;

releasing said frame and said ultraviolet tape, thereby lowering said semiconductor wafer relative to said frame;

breaking said semiconductor wafer into a plurality of dice along said cut lines by plunging a breaking jig against the side of said semiconductor wafer adhered to said ultraviolet sensitive tape and opposite to the scribed side of said semiconductor wafer; and irradiating said ultraviolet sensitive tape with ultraviolet light to reduce the adhesiveness of said ultraviolet sensitive tape.

2. A method of producing semiconductor devices according to claim 1 including delivering said semiconductor wafer divided into said dice and held on said ultraviolet sensitive tape with the adhesiveness reduced by irradiation with ultraviolet rays to a die-bonding apparatus.

3. A method of producing semiconductor devices according to claim 1 wherein said scribing step, said breaking step, and said irradiating step are executed in each of a plurality of parallel process lines that commonly receive mounted wafer from said wafer placing step.

4. A method of producing semiconductor devices according to claim 3 including loading semiconductor wafers mounted on respective annular frames in wafer cassettes, each cassette containing a predetermined number of wafers, and delivering said cassettes to the scribing step in the respective processing lines.

5. A method of producing semiconductor devices according to claim 3 including loading semiconductor wafers mounted on respective annular frames in wafer cassettes, each containing a predetermined number of wafers, and delivering said wafers one-by-one to the scribing step in the respective processing lines.

6. A method of producing semiconductor devices according to claim 1, wherein said wafer mounting step, said scribing step, said breaking step, and said ultraviolet irradiation step are conducted in each of a plurality parallel processing lines.

7. A method of producing semiconductor devices according to claim 1 including delivering semiconductor wafers to said wafer mounting step in successive wafer cassettes, each cassette containing a predetermined number of wafers, and delivering a plurality of annular frames carrying said wafers after irradiation with ultraviolet rays to a subsequent step in an annular frame cassette which contains said plurality of annular frames.

8. A method of producing semiconductor device according to claim 1 including scribing the cut lines so that the thickness of the uncut semiconductor wafer at the cut lines is no more than thirty microns.

* * * * *